(12) United States Patent
Drane et al.

(10) Patent No.: US 10,162,600 B2
(45) Date of Patent: *Dec. 25, 2018

(54) METHOD AND APPARATUS FOR USE IN THE DESIGN AND MANUFACTURE OF INTEGRATED CIRCUITS

(71) Applicant: Imagination Technologies Limited, Kings Langley (GB)

(72) Inventors: Theo Alan Drane, London (GB); Wai-Chuen Cheung, London (GB)

(73) Assignee: Imagination Technologies Limited, Kings Langley (GB)

(*) Notice: Subject to any disclaimer, the term of this patent is extended or adjusted under 35 U.S.C. 154(b) by 0 days.

This patent is subject to a terminal disclaimer.

(21) Appl. No.: 15/898,455

(22) Filed: Feb. 17, 2018

(65) Prior Publication Data

US 2018/0239585 A1    Aug. 23, 2018

Related U.S. Application Data

(63) Continuation of application No. 13/626,886, filed on Sep. 26, 2012, now Pat. No. 9,933,997.

(30) Foreign Application Priority Data

Oct. 6, 2011  (GB) .................................... 1117318.4

(51) Int. Cl.
```
G06F 7/38      (2006.01)
G06F 7/535     (2006.01)
G06F 17/50     (2006.01)
```
(52) U.S. Cl.
CPC ............... *G06F 7/38* (2013.01); *G06F 7/535* (2013.01); *G06F 17/50* (2013.01); *G06F 17/505* (2013.01); *G06F 17/5045* (2013.01)

(58) Field of Classification Search
CPC ...... G06F 17/5045–17/5054; G06F 2207/5356
See application file for complete search history.

(56) References Cited

U.S. PATENT DOCUMENTS 9,753,693 B2    9/2017  Rose
2005/0289209 A1  12/2005  Robison
(Continued)

FOREIGN PATENT DOCUMENTS

EP    0821303 A    1/1998

OTHER PUBLICATIONS

D. J. Magenheimer, L. Peters, K. Pettis, D. Zuras, "Integer multiplication and division on the HP precision architecture", IEEE Trans. Comput., vol. 37, pp. 980-990, 1988.*

(Continued)

*Primary Examiner* — Matthew D Sandifer
(74) *Attorney, Agent, or Firm* — Vorys, Sater, Seymour and Pease LLP; Vincent M DeLuca

(57) ABSTRACT

A method and apparatus are provided for manufacturing integrated circuits performing invariant integer division x/d. A desired rounding mode is provided and an integer triple (a,b,k) for this rounding mode is derived. Furthermore, a set of conditions for the rounding mode is derived. An RTL representation is then derived using the integer triple. From this a hardware layout can be derived and an integrated circuit manufactured with the derived hardware layout. When the integer triple is derived a minimum value of k for the desired rounding mode and set of conditions is also derived.

17 Claims, 1 Drawing Sheet

(56) References Cited

U.S. PATENT DOCUMENTS

2006/0095486 A1   5/2006  Ferguson
2006/0095494 A1   5/2006  Kumar
2008/0295056 A1   11/2008 Wen et al.

OTHER PUBLICATIONS

Blinn, "Three Wrongs Make a Right," IEEE Computer Graphics and Applications, Nov. 1995, pp. 90-93.
Ugurdag et al, "Hardware Division by Small Integer Constants," in IEEE Transactions on Computers, vol. 66, No. 12, pp. 2097-2110, Dec. 1, 2017.
Lee et al, "Accuracy-Guaranteed Bit-Width Optimization," Oct. 2006, IEEE Transactions on Computer-Aided Design of Integrated Circuits and Systems, vol. 25, No. 10, pp. 1900-2000.
Robison, "N-Bit Unsigned Division Via N-Bit Multiply-Add," 2005, 17th IEEE Symposium on Computer Arithmetic, pp. 1-9.
Optimizing Integer Division by a constant Divisor Grappel Dr. Dobbs drdobbs.comlparallel/184408499.
Correctly Rounded Constant Integer Divison via Multiply-Add cas.ee.ic.ac.uk/people/gac1/pubs/theoiscas12.pdf (Drane).
Integer Multiplication and Division on the HP Precision Architecture Magenheimer IEEE Transactions on Computers vol. 37 No. 8, Aug. 1988.
N Bit unsigned division via n-bit multiply-add Robison available on http://arith.polito.it.final/paper-104.pdf.

* cited by examiner

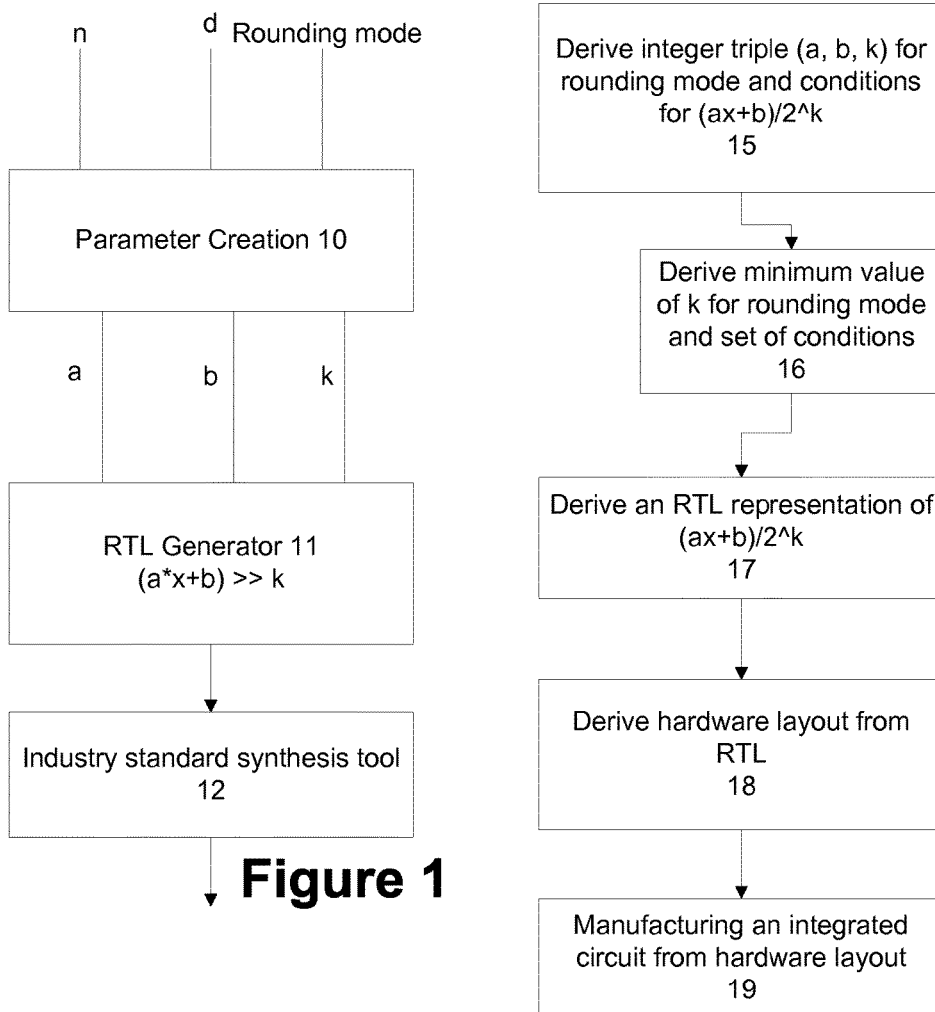
Figure 1
Figure 2
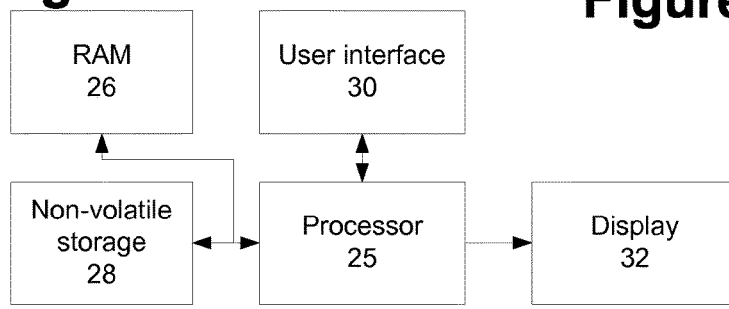
Figure 3

METHOD AND APPARATUS FOR USE IN THE DESIGN AND MANUFACTURE OF INTEGRATED CIRCUITS

CROSS-REFERENCE TO RELATED APPLICATIONS

This application claims priority from GB App. No. 1117318.4, filed on Oct. 6, 2011, and which is incorporated by reference in its entirety herein.

BACKGROUND

Field

The following relates to methods and apparatus for use in the design and manufacture of integrated circuits, and particularly to the design and manufacture of circuits that perform divisions.

Related Art

When designing and manufacturing ICs, sophisticated synthesis tools such as Synopsis™ Design Compiler are used to convert a desired function which must be implemented in the IC into a set of logic gates to perform the functions. Functions which need to be implemented include add, subtract, multiply and divide. The synthesis tools seek to implement the desired functions in an efficient manner in logic gates.

The tools operate by converting a function to be implemented, such as divide by x, to what is known as register transfer level (RTL), which defines a circuit's behavior in terms of the flow of signals between hardware registers and the logical operations performed on these signals. This is then used to generate a high level representation of a circuit from which appropriate gate level representations and the ultimate IC design can be derived for manufacture, and an IC can then be made. If a synthesis tool is presented with division by a constant such as x/d, it will invariably use RTL designed for non-constant division. A designer could note that in the case of constant division an implementation of the form $(ax+b)/2^k$ could potentially make smaller ICs. The designer would then have to work out values for the triple (a,b,k) which would perform the task of x/d. As explained in the Summary below, the present inventors have appreciated that by representing integer division in the form $(ax+b)/2^k$ rather than the conventional x/d division input to an RTL generator, the division is implemented using a multiply-add implementation for various rounding modes.

Division is acknowledged to be an expensive operation to perform in hardware. However in the case where the divisor is known to be a constant, efficient hardware implementations can be constructed. Consider the division of an unsigned n bit integer x by a known invariant integer constant d:

$$\frac{x}{d} \quad x \in [0, 2^n - 1] \; d \in N$$

For the purposes of the exposition we will assume that d is an odd integer larger than 1, the following schemes can be easily modified for even d by those skilled in the art. We consider an implementation of the form:

$$\frac{x}{d} \approx \left\lfloor \frac{ax+b}{2^k} \right\rfloor$$

Where a, b and k are non negative integers. Note that without loss of generality we can assume that a is odd. The prior art in the case where the rounding used is round towards zero and d is an unsigned m bit number comes from [1] and can be succinctly summarised setting:

$$\left\lfloor \frac{x}{d} \right\rfloor = \left\lfloor \frac{ax+b}{2^k} \right\rfloor$$

$$t = \left\lfloor \frac{2^{n+m-1}}{d} \right\rfloor$$

$$k = n + m - 1$$

$$a = (d(t+1) \bmod 2^n \leq 2^{m-1}) ? \; t+1 : t$$

$$b = (d(t+1) \bmod 2^n \leq 2^{m-1}) ? \; 0 : t$$

The second piece of prior art comes from [2] where the rounding mode used is round to nearest, $d = 2^n - 1$ and x is the result of a multiplication of two unsigned n bit numbers a and b:

$$\left\lfloor \frac{ab}{2^n - 1} + \frac{1}{2} \right\rfloor = \left\lfloor \frac{(2^n+1)(ab+2^{n+1})}{2^{2n}} \right\rfloor$$

When a division is to be performed such as divide by d, the integer triple discussed above is generated and provided to a RTL generation unit, which produces the gate level circuits required as an input to a synthesis tool which then generates the hardware components required for manufacture.

REFERENCES

[1] Robison, A. D., "N-bit unsigned division via n-bit multiply-add," in ARITH-17 17th IEEE Symposium on Computer Arithmetic, 2005, pp. 131-139.

[2] Blinn, J., "Jim Blinn's Corner: Dirty Pixels," Publisher: Morgan Kauf nann, ISBN-13: 978-1558604551, 29 Sep. 1998, pp. 211-221.

SUMMARY

Aspects include methods and apparatus to design an integrated circuit for performing invariant integer division for a desired rounding mode such as round towards zero, round to nearest and faithful rounding, and integrated circuits according to such design.

In an example, the necessary and sufficient conditions for a given integer triple of (a,b,k) to give the required answer for a desired rounding mode are produced. In the application of a hardware scheme an algorithm is presented which will fit into a synthesis flow and produce the most efficient hardware. In particular, we have appreciated that by representing integer division in the form $(ax+b)/2^k$ and implementing this, rather than the conventional x/d division input to an RTL generator, that the division is implemented using a multiply-add implementation for various rounding modes. Three rounding modes are described here but the principle can be extended to any rounding mode. Using such an approach results in a hardware implementation for the division which can have up to a 50% decrease in integrated circuit area required.

In accordance with one aspect, there is provided a method for manufacturing an integrated circuit for performing invariant integer division (x/d) comprises: deriving a integer triple (a,b,k) for a desired rounding mode and set of conditions where $x/d=(ax+d)/2^k$; deriving an RTL representation of the $(ax+d)/2^k$ representation of the division using the integer triple; deriving a minimum value of k for a desired rounding mode and a set of conditions deriving a hardware layout from the RTL representation; and manufacturing an integrated circuit with the derived hardware layout.

BRIEF DESCRIPTION OF THE DRAWINGS

FIG. 1 shows a block diagram of circuitry embodying an example according to the disclosure.

FIG. 2 shows a method that can be implemented in examples according to the disclosure.

FIG. 3 depicts apparatus that can be used to implement aspects of the disclosure.

DETAILED DESCRIPTION

Exemplary aspects of the disclosure are described with reference to three rounding modes. Other rounding modes may also be implemented.

We first present the necessary and sufficient conditions for a given triple of (a,b,k) to implement each of the three following rounding schemes.

Round Towards Zero (Rtz)

In this case we require:

$$\left\lfloor \frac{x}{d} \right\rfloor = \left\lfloor \frac{ax+b}{2^k} \right\rfloor$$

$$0 \le \frac{ax+b}{2^k} - \left(\frac{x-(x \bmod d)}{d}\right) < 1$$

$$x\left(1-\frac{ad}{2^k}\right) - \frac{bd}{2^k} \le x \bmod d < x\left(1-\frac{ad}{2^k}\right) - \frac{bd}{2^k} + d$$

Now the sawtooth function x mod d is discontinuous in x with peaks at x=md−1 where 1≤m≤floor($2^n$/d) and troughs at x=md for 0≤m≤floor($2^n$/d). It suffices to check that the upper bound error condition is met for md−1 and the lower bound error condition is met for md:

$$md\left(1-\frac{ad}{2^k}\right) - \frac{bd}{2^k} \le 0 \quad d-1 < (md-1)\left(1-\frac{ad}{2^k}\right) - \frac{bd}{2^k} + d$$

$$m(2^k - ad) \le b \qquad m(ad - 2^k) < a - b$$

$$\text{where } 0 \le m \le \left\lfloor \frac{2^n}{d} \right\rfloor \qquad \text{where } 0 < m \le \left\lfloor \frac{2^n}{d} \right\rfloor$$

Now given that a and d is odd then $ad-2^k \ne 0$. Depending on the sign of $ad-2^k$ different values of m will stress these inequalities. It follows that the necessary and sufficient conditions for the implementation of round towards zero mode for the IC design is:

$$\left\lfloor \frac{x}{d} \right\rfloor = \left\lfloor \frac{ax+b}{2^k} \right\rfloor \iff$$
$$x \in [0, 2^n - 1]$$

$$\frac{b+1}{\lfloor 2^n/d \rfloor} < ad - 2^k < a - b \quad \text{if } ad - 2^k < 0$$

$$ad - 2^k < \frac{a-b}{\lfloor 2^n/d \rfloor} \quad \text{if } ad - 2^k > 0$$

Round to Nearest (RTN)

In this case we require:

$$\left\lfloor \frac{x}{d} + \frac{1}{2} \right\rfloor = \left\lfloor \frac{ax+b}{2^k} \right\rfloor$$

$$0 \le \frac{ax+b}{2^k} - \left(\frac{(2x+d)-((2x+d)\bmod d)}{2d}\right) < 1$$

$$2x\left(1-\frac{ad}{2^k}\right) - \frac{bd}{2^{k-1}} + d \le (2x+d) \bmod 2d < 2x\left(1-\frac{ad}{2^k}\right) - \frac{bd}{2^{k-1}} + 3d$$

Now the sawtooth function (2x+d) mod 2d is discontinuous in x with peaks at md−(d+1)/2 where 0<m≤floor($(2^{n+1}+d-1)/2d$) and troughs at md−(d−1)/2 for 0<m≤floor($(2^{n+1}+d-3)/2d$). It suffices to check the upper bound error condition is met for the peaks and the lower bound condition is met for the troughs:

$$2\left(md - \frac{d-1}{2}\right)\left(1 - \frac{ad}{2^k}\right) - \frac{bd}{2^{k-1}} + d \le 1$$

$$2m(2^k - ad) \le 2b - a(d-1)$$

$$\text{where } 0 < m \le \left\lfloor \frac{2^{n+1}+d-3}{2d} \right\rfloor$$

$$2d - 1 < 2\left(md - \frac{d+1}{2}\right)\left(1 - \frac{ad}{2^k}\right) - \frac{bd}{2^{k-1}} + 3d$$

$$2m(ad - 2^k) < a(d+1) - 2b$$

$$\text{where } 0 < m \le \left\lfloor \frac{2^{n+1}+d-1}{2d} \right\rfloor$$

Now given that a and d is odd then $ad-2^k \ne 0$. Depending on the sign of $ad-2^k$ different values of m will stress these inequalities. It follows that the necessary and sufficient conditions for implementation of round towards nearest for the IC design is:

$$\left\lfloor \frac{x}{d} + \frac{1}{2} \right\rfloor = \left\lfloor \frac{ax+b}{2^k} \right\rfloor \iff$$
$$x \in [0, 2^n - 1]$$

$$\frac{a(d-1)-2b-1}{2\lfloor(2^{n+1}+d-3)/2d\rfloor} < ad - 2^k < a\left(\frac{d+1}{2}\right) - b \quad \text{if } ad - 2^k < 0$$

$$a\left(\frac{d-1}{2}\right) - b \le ad - 2^k < \frac{a(d-1)-2b}{2\lfloor(2^{n+1}+d-1)/2d\rfloor} \quad \text{if } ad - 2^k > 0$$

Faithful Rounding (FR1)

In this case we can return either integer that lies either side of the true side, if the true answer is an integer we must return that integer:

$$\text{Case } x = md \quad m\left\lfloor \frac{amd+b}{2^k} \right\rfloor$$

-continued $$0 \le m \le \lfloor 2^n/d \rfloor \quad 0 \le \frac{amd+b}{2^k} - m < 1$$

$$-b \le m(ad - 2^k) < 2^k - b$$

Case $x \bmod d > 0$ $$0 \le \frac{ax+b}{2^k} - \left\lfloor \frac{x}{d} \right\rfloor < 2$$

$$x\left(1 - \frac{ad}{2^k}\right) - \frac{bd}{2^k} \le x \bmod d < x\left(1 - \frac{ad}{2^k}\right) - \frac{bd}{2^k} + 2d$$

Now for the second case the sawtooth function x mod d is discontinuous in x with peaks at x=md−1 where 0<m≤floor($2^n$/d) and troughs at x=md+1 (note we are assuming x≠md) for 0≤m≤floor($2^n$/d). It suffices to check that the upper bound error condition is met for md−1 and the lower bound error condition is met for md+1:

$$(md+1)\left(1 - \frac{ad}{2^k}\right) - \frac{bd}{2^k} \le 1$$

$$m(2^k - ad) \le a + b$$

where $0 \le m \le \left\lfloor \frac{2^n}{d} \right\rfloor$ $$d - 1 < (md-1)\left(1 - \frac{ad}{2^k}\right) - \frac{bd}{2^k} + 2d$$

$$m(ad - 2^k) < 2^k + a - b$$

where $0 < m \le \left\lfloor \frac{2^n}{d} \right\rfloor$

Now given that a and d is odd then ad−$2^k$≠0. Depending on the sign of ad−$2^k$ different values of m will stress these inequalities in the two cases. It follows that the necessary and sufficient conditions for implementation of faithful rounding is:

$$\left\lfloor \frac{x}{d} \right\rfloor \text{ or } \left\lceil \frac{x}{d} \right\rceil = \left\lfloor \frac{ax+b}{2^k} \right\rfloor \quad \Leftrightarrow \quad \begin{array}{l} \lfloor 2^n/d \rfloor(2^k - ad) \le b < 2^k \text{ if } ad - 2^k < 0 \\ \lfloor 2^n/d \rfloor(ad - 2^k) < 2^k - b \text{ if } ad - 2^k > 0 \end{array}$$

$$x \in [0, 2^n - 1]$$

Minimal Hardware Implementation Scheme

Minimal hardware implementations in the IC will result from minimising the number of partial product bits in ax+b. The scheme used achieves this as follows:
 1 Minimise k producing kopt.
 2 For the range of acceptable values of a for a given kopt choose the one that results in the smallest constant multiplier. This can be accomplished by choosing a value for a which has the smallest number of non zero elements in a Canonical Signed Digit representation of a. This will result in aopt. Define this function as minCSD(x).
 3 For the range of valid values for b having fixed kopt and aopt choose the one with smallest Hamming weight, as this minimises the number of partial products bits. If there are a range of numbers that have smallest Hamming weight, we choose the one that has smallest value as this will add 1s into the least significant bits of the array where the height of the array is smallest. Define the function which finds this value for numbers in the interval [a, b] as minHamm(a, b). Note that the minHamm(a, b) function can be computed as follows:

```
Input   unsigned a[p − 1 : 0],b[p − 1 : 0]
Output  unsigned c[p − 1 : 0]
```

```
c = 0
for  i = p − 1; i ≥ 0; i −−
loop
    if  a[i] == b[i]  then  c[i] = a[i]; a[i] = 0;
    else  c += 2^{⌊log2 a⌋}; break;
endloop
return c
```

Now applying this scheme to the space of allowable (a,b,k) as derived by the rounding mode and set of conditions we can construct a minimal hardware implementation for each of the three rounding schemes:

RTZ Minimal Hardware Implementation when ad−$2^K$>0

In this case we require:

$$ad - 2^k < \frac{a-b}{\lfloor 2^n/d \rfloor}$$

Now note that the right hand side is strictly decreasing in b. So for any valid a, b and k we can always set b=0 and then the condition will still be met, plus it will cost less hardware to implement. Hence a minimal hardware implementation will have b=0. Thus our condition reduces to:

$$(ad - 2^k)\lfloor 2^n/d \rfloor < a$$

$$\frac{2^k}{d} < a < \frac{2^k \lfloor 2^n/d \rfloor}{d \lfloor 2^n/d \rfloor - 1}$$

Given that a must be an integer we have a formula for kopt:

$$k_{opt} = \min\left(k : \frac{1}{2^k}\left\lceil \frac{2^k}{d} \right\rceil < \frac{\lfloor 2^n/d \rfloor}{d \lfloor 2^n/d \rfloor - 1}\right)$$

$$k_{opt} = \min\left(k : \frac{2^k}{(-2^k) \bmod d} < d\left\lfloor \frac{2^n}{d} \right\rfloor - 1\right)$$

And kopt is the smallest such valid k hence:

$$\frac{1}{2^{k_{opt}-1}}\left\lceil \frac{2^{k_{opt}-1}}{d} \right\rceil \ge \frac{\lfloor 2^n/d \rfloor}{d\lfloor 2^n/d \rfloor - 1}$$

$$2\left\lceil \frac{2^{k_{opt}-1}}{d} \right\rceil \ge \frac{2^{k_{opt}}\lfloor 2^n/d \rfloor}{d\lfloor 2^n/d \rfloor - 1}$$

$$\left\lceil \frac{2^{k_{opt}}}{d} \right\rceil + 1 \ge \frac{2^{k_{opt}}\lfloor 2^n/d \rfloor}{d\lfloor 2^n/d \rfloor - 1}$$

Hence a=ceil($2^{k_{opt}}$/d) is valid but a=ceil($2^{k_{opt}}$/d)+1 is not valid. It follows that the there is only valid value for a when k=kopt. We can now state that the design which minimises k and satisfies ad $2^k$>0 is unique and is defined by:

$$k_{opt}^+ = \min\left(k : \frac{2^k}{(-2^k) \bmod d} > d\left\lfloor \frac{2^n}{d} \right\rfloor - 1\right)$$

$$a_{opt}^+ = \left\lceil \frac{2^{k_{opt}^+}}{d} \right\rceil$$

$$b_{opt}^+ = 0$$

RTZ Minimal Hardware Implementation when $ad-2^K<0$
In this case we need:

$$-\frac{b+1}{\lfloor 2^n/d \rfloor} < ad - 2^k < a - b \qquad 5$$

Hence b must necessarily be in the following interval:

$$b \in [(2^k-ad)\lfloor 2^n/d \rfloor, 2^k+a-ad-1] \qquad 10$$

This interval must be non empty so:

$$2^k + a - ad > (2^k - ad)\lfloor 2^n/d \rfloor$$

$$\frac{2^k}{d} > a > \frac{2^k(\lfloor 2^n/d \rfloor - 1)}{d\lfloor 2^n/d \rfloor - d + 1}$$

Given that a must be an integer we have a formula for kopt:

$$k_{opt} = \min\left(k : \frac{1}{2^k}\left\lfloor\frac{2^k}{d}\right\rfloor > \frac{\lfloor 2^n/d \rfloor - 1}{d\lfloor 2^n/d \rfloor - d + 1}\right)$$

$$k_{opt} = \min\left(k : \frac{2^k}{2^k \bmod d} > d\left\lfloor\frac{2^n}{d}\right\rfloor - d + 1\right)$$

Where kopt is the smallest such valid k hence:

$$\frac{1}{2^{k_{opt}-1}}\left\lfloor\frac{2^{k_{opt}-1}}{d}\right\rfloor \leq \frac{\lfloor 2^n/d \rfloor - 1}{d\lfloor 2^n/d \rfloor - d + 1}$$

$$2\left\lfloor\frac{2^{k_{opt}-1}}{d}\right\rfloor \leq \frac{2^{k_{opt}}(\lfloor 2^n/d \rfloor - 1)}{d\lfloor 2^n/d \rfloor - d + 1}$$

$$\left\lceil\frac{2^{k_{opt}}}{d}\right\rceil - 1 \leq \frac{2^{k_{opt}}(\lfloor 2^n/d \rfloor - 1)}{d\lfloor 2^n/d \rfloor - d + 1} \qquad 40$$

Hence $a = \text{floor}(2^{k_{opt}}/d)$ is valid but $a = \text{floor}(2^{k_{opt}}/d)-1$ is not valid. It follows that the there is only valid value for a when $k = k_{opt}$. We can now state that the design which minimises k and satisfies $ad-2^k<0$ is unique in k and a and is defined by:

$$k_{opt}^- = \min\left(k : \frac{2^k}{2^k \bmod d} > d\left\lfloor\frac{2^n}{d}\right\rfloor - d + 1\right)$$

$$a_{opt}^- = \left\lfloor\frac{2^{k_{opt}^-}}{d}\right\rfloor$$

$$b_{opt}^- = \text{minHamm}\left((2^{k_{opt}^-} - a_{opt}^-d)\lfloor 2^n/d \rfloor, 2^{k_{opt}^-} - a_{opt}^-(d-1) - 1\right)$$

Where minHamm(a, b) returns the number of smallest value from the numbers of smallest Hamming weight found within the interval [a, b].

RTZ Minimal Hardware Design
Summarizing the previous sections we have the following algorithm:

$$k_{opt}^+ = \min\left(k : \frac{2^k}{(-2^k)\bmod d} > d\left\lfloor\frac{2^n}{d}\right\rfloor - 1\right) \qquad 65$$

-continued $$a_{opt}^+ = \left\lceil\frac{2^{k_{opt}^+}}{d}\right\rceil$$

$$b_{opt}^+ = 0$$

$$k_{opt}^- = \min\left(k : \frac{2^k}{2^k \bmod d} > d\left\lfloor\frac{2^n}{d}\right\rfloor - d + 1\right)$$

$$a_{opt}^- = \left\lfloor\frac{2^{k_{opt}^-}}{d}\right\rfloor$$

$$b_{opt}^- = \text{minHamm}\left((2^{k_{opt}^-} - a_{opt}^-d)\lfloor 2^n/d \rfloor, 2^{k_{opt}^-} - a_{opt}^-(d-1) - 1\right)$$

$$\{k_{opt}, a_{opt}, b_{opt}\} = (k_{opt}^+ < k_{opt}^-) ? \{k_{opt}^+, a_{opt}^+, b_{opt}^+\} : \{k_{opt}^-, a_{opt}^-, b_{opt}^-\}$$

Note that kopt$^+$ is never equal to kopt$^-$, otherwise if kopt=kopt$^+$=kopt$^-$ then:

$$\frac{2^k}{(-2^k)\bmod d} > d\left\lfloor\frac{2^n}{d}\right\rfloor - 1 \geq \frac{2^{k-1}}{(-2^{k-1})\bmod d}$$

$$\frac{2^k}{2^k \bmod d} > d\left\lfloor\frac{2^n}{d}\right\rfloor - d + 1 \geq \frac{2^{k-1}}{2^{k-1}\bmod d}$$

Simplifying these two conditions we get:

$$2((-2^{k-1})\bmod d) > (-2^k)\bmod d$$

$$2(2^{k-1} \bmod d) > 2^k \bmod d$$

$$2(2^{k-1} \bmod d) > 2^k \bmod d > 2(2^{k-1} \bmod d) - d$$

This is a contradiction as $2^k$ mod d is equal to one of these limits.

RTN Minimal Hardware Implementation when $ad-2^K>0$
In this case we need:

$$a\left(\frac{d-1}{2}\right) - b \leq ad - 2^k < \frac{a(d+1) - 2b}{2\lfloor(2^{n+1}+d-1)/2d\rfloor}$$

Hence b must necessarily be in the following interval:

$$b \in \left[a\left(\frac{d-1}{2}\right) + 2^k - ad, \, a\left(\frac{d+1}{2}\right) + (2^k - ad)\left\lfloor\frac{2^{n+1}+d-1}{2d}\right\rfloor - 1\right]$$

This interval must be non empty so:

$$a\left(\frac{d+1}{2}\right) + (2^k - ad)\left\lfloor\frac{2^{n+1}+d-1}{2d}\right\rfloor > a\left(\frac{d-1}{2}\right) + 2^k - ad$$

$$\frac{2^k}{d} < a < \frac{2^k\lfloor(2^{n+1}-d-1)/2d\rfloor}{d\lfloor(2^{n+1}-d-1)/2d\rfloor - 1}$$

Given that a must be an integer we have a formula for kopt:

$$k_{opt} = \min\left(k : \frac{1}{2^k}\left\lceil\frac{2^k}{d}\right\rceil < \frac{\lfloor(2^{n+1}-d-1)/2d\rfloor}{d\lfloor(2^{n+1}-d-1)/2d\rfloor - 1}\right)$$

$$k_{opt} = \min\left(k : \frac{2^k}{(-2^k)\bmod d} > d\left\lfloor\frac{2^{n+1}-d-1}{2d}\right\rfloor - 1\right)$$

Where kopt is the smallest such valid k hence:

$$\frac{1}{2^{k_{opt}-1}}\left\lceil\frac{2^{k_{opt}-1}}{d}\right\rceil \geq \frac{\lfloor(2^{n+1}-d-1)/2d\rfloor}{d\lfloor(2^{n+1}-d-1)/2d\rfloor - 1}$$

$$2\left\lceil\frac{2^{k_{opt}-1}}{d}\right\rceil \geq \frac{2^{k_{opt}}\lfloor(2^{n+1}-d-1)/2d\rfloor}{d\lfloor(2^{n+1}-d-1)/2d\rfloor - 1}$$

$$\left\lfloor\frac{2^{k_{opt}}}{d}\right\rfloor + 1 \geq \frac{2^{k_{opt}}\lfloor(2^{n+1}-d-1)/2d\rfloor}{d\lfloor(2^{n+1}-d-1)/2d\rfloor - 1}$$

Hence $a = \text{ceil}(2^{k_{opt}}/d)$ is valid but $a = \text{ceil}(2^{k_{opt}}/d)+1$ is not valid. It follows that the there is only valid value for a when $k = k_{opt}$. The design which minimises k and satisfies $ad - 2^k > 0$ is unique and is defined by:

$$k_{opt}^{+} = \min\left(k : \frac{2^k}{(-2^k)\bmod d} > d\left\lfloor\frac{2^{n+1}-d-1}{2d}\right\rfloor - 1\right)$$

$$a_{opt}^{+} = \left\lceil\frac{2^{k_{opt}^{+}}}{d}\right\rceil$$

$$b_{opt}^{+} = \text{minHamm}\left(a_{opt}^{+}\left(\frac{d-1}{2}\right) + 2^{k_{opt}^{+}} - a_{opt}^{+}d,\right.$$
$$\left. a_{opt}^{+}\left(\frac{d+1}{2}\right) + (2^{k_{opt}^{+}} - a_{opt}^{+}d)\left\lfloor\frac{2^{n+1}+d-1}{2d}\right\rfloor - 1\right)$$

Where minHamm(a, b) returns the number of smallest value from the numbers of smallest Hamming weight found within the interval [a, b].

RTN Minimal Hardware Implementation when $ad - 2^K < 0$

In this case we need:

$$\frac{a(d-1)-2b-1}{2\lfloor(2^{n+1}+d-3)/2d\rfloor} < ad - 2^k < a\left(\frac{d+1}{2}\right) - b$$

Hence b must necessarily be in the following interval:

$$b \in \left[a\left(\frac{d-1}{2}\right) + (2^k - ad)\left\lfloor\frac{2^{n+1}+d-3}{2d}\right\rfloor, a\left(\frac{d+1}{2}\right) + 2^k - ad - 1\right]$$

This interval must be non empty so:

$$a\left(\frac{d+1}{2}\right) + 2^k - ad > a\left(\frac{d-1}{2}\right) + (2^k - ad)\left\lfloor\frac{2^{n+1}+d-3}{2d}\right\rfloor$$

$$\frac{2^k}{d} > a > \frac{2^k\lfloor(2^{n+1}-d-3)/2d\rfloor}{d\lfloor(2^{n+1}-d-3)/2d\rfloor + 1}$$

Given that a must be an integer we have a formula for kopt:

$$k_{opt} = \min\left(k : \frac{1}{2^k}\left\lfloor\frac{2^k}{d}\right\rfloor > \frac{\lfloor(2^{n+1}-d-3)/2d\rfloor}{d\lfloor(2^{n+1}-d-3)/2d\rfloor + 1}\right)$$

$$k_{opt} = \min\left(k : \frac{2^k}{2^k\bmod d} > d\left\lfloor\frac{2^{n+1}-d-3}{2d}\right\rfloor + 1\right)$$

Where kopt is the smallest such valid k hence:

$$\frac{1}{2^{k_{opt}-1}}\left\lfloor\frac{2^{k_{opt}-1}}{d}\right\rfloor \leq \frac{\lfloor(2^{n+1}-d-3)/2d\rfloor}{d\lfloor(2^{n+1}-d-3)/2d\rfloor + 1}$$

$$2\left\lfloor\frac{2^{k_{opt}-1}}{d}\right\rfloor \leq \frac{2^{k_{opt}}\lfloor(2^{n+1}-d-3)/2d\rfloor}{d\lfloor(2^{n+1}-d-3)/2d\rfloor + 1}$$

$$\left\lfloor\frac{2^{k_{opt}}}{d}\right\rfloor - 1 \leq \frac{2^{k_{opt}}\lfloor(2^{n+1}-d-3)/2d\rfloor}{d\lfloor(2^{n+1}-d-3)/2d\rfloor + 1}$$

Hence $a = \text{floor}(2^{k_{opt}}/d)$ is valid but $a = \text{floor}(2^{k_{opt}}/d)-1$ is not valid. It follows that the there is only valid value for a when $k = k_{opt}$. The design which minimises k and satisfies $ad - 2^k < 0$ is unique in k and a and is defined by:

$$k_{opt}^{-} = \min\left(k : \frac{2^k}{2^k\bmod d} > d\left\lfloor\frac{2^{n+1}-d-3}{2d}\right\rfloor + 1\right)$$

$$a_{opt}^{-} = \left\lfloor\frac{2^{k_{opt}^{-}}}{d}\right\rfloor$$

$$b_{opt}^{-} = \text{minHamm}\left(a_{opt}^{-}\left(\frac{d-1}{2}\right) + (2^{k_{opt}^{-}} - a_{opt}^{-}d)\left\lfloor\frac{2^{n+1}+d-3}{2d}\right\rfloor,\right.$$
$$\left. a_{opt}^{-}\left(\frac{d+1}{2}\right) + 2^{k_{opt}^{-}} - a_{opt}^{-}d - 1\right)$$

Where minHamm(a, b) returns the number of smallest value from the numbers of smallest Hamming weight found within the interval [a, b].

RTN Minimal Hardware Design

Summarizing the previous sections results in the following algorithm:

$$k_{opt}^{+} = \min\left(k : \frac{2^k}{(-2^k)\bmod d} > d\left\lfloor\frac{2^{n+1}-d-1}{2d}\right\rfloor - 1\right)$$

$$a_{opt}^{+} = \left\lceil\frac{2^{k_{opt}^{+}}}{d}\right\rceil$$

$$b_{opt}^{+} = \text{minHamm}\left(a_{opt}^{+}\left(\frac{d-1}{2}\right) + 2^{k_{opt}^{+}} - a_{opt}^{+}d,\right.$$
$$\left. a_{opt}^{+}\left(\frac{d+1}{2}\right) + (2^{k_{opt}^{+}} - a_{opt}^{+}d)\left\lfloor\frac{2^{n+1}+d-1}{2d}\right\rfloor - 1\right)$$

$$k_{opt}^{-} = \min\left(k : \frac{2^k}{2^k\bmod d} > d\left\lfloor\frac{2^{n+1}-d-3}{2d}\right\rfloor + 1\right)$$

$$a_{opt}^{-} = \left\lfloor\frac{2^{k_{opt}^{-}}}{d}\right\rfloor$$

$$b_{opt}^{-} = \text{minHamm}\left(a_{opt}^{-}\left(\frac{d-1}{2}\right) + (2^{k_{opt}^{-}} - a_{opt}^{-}d)\left\lfloor\frac{2^{n+1}+d-3}{2d}\right\rfloor,\right.$$
$$\left. a_{opt}^{-}\left(\frac{d+1}{2}\right) + 2^{k_{opt}^{-}} - a_{opt}^{-}d - 1\right)$$

$$\{k_{opt}, a_{opt}, b_{opt}\} = (k_{opt}^{+} < k_{opt}^{-})?\{k_{opt}^{+}, a_{opt}^{+}, b_{opt}^{+}\} : \{k_{opt}^{-}, a_{opt}^{-}, b_{opt}^{-}\}$$

Note that kopt is never equal to kopt⁻, otherwise if kopt=kopt⁺=kopt⁻ then:

$$\frac{2^k}{(-2^k)\bmod d} > d\left\lfloor\frac{2^{n+1}-d-1}{2d}\right\rfloor - 1 \geq \frac{2^{k-1}}{(-2^{k-1})\bmod d}$$

-continued $$\frac{2^k}{2^k \bmod d} > d\left\lfloor\frac{2^{n+1}-d-3}{2d}\right\rfloor + 1 \geq \frac{2^{k-1}}{2^{k-1}\bmod d}$$

Simplifying these two conditions we get:

$$2((-2^{k-1}) \bmod d) > (-2^k) \bmod d$$

$$2(2^{k-1} \bmod d) > 2^k \bmod d$$

$$2(2^{k-1} \bmod d) > 2^k \bmod d > 2(2^{k-1} \bmod d) - d$$

This is a contradiction as $2^k \bmod d$ is equal to one of these limits.

FR1 Minimal Hardware Implementation when $ad - 2^K > 0$

In this case we require:

$$\lfloor 2^n/d \rfloor (ad - 2^k) < 2^k - b$$

Now note that the right hand side is strictly decreasing in b. So for any valid a, b and k we can always set b=0 and then condition will still be met, plus cost less hardware to implement. Hence minimal hardware implementations will have b=0. Thus our condition reduces to:

$$\lfloor 2^n/d \rfloor (ad - 2^k) < 2^k$$

$$\frac{2^k}{d} < a < \frac{2^k \lceil 2^n/d \rceil}{d \lfloor 2^n/d \rfloor}$$

Given that a must be an integer we have a formula for kopt:

$$k_{opt} = \min\left(k: \frac{1}{2^k}\left\lceil\frac{2^k}{d}\right\rceil < \frac{\lceil 2^n/d \rceil}{d\lfloor 2^n/d \rfloor}\right)$$

$$k_{opt} = \min\left(k: \frac{2^k}{(-2^k)\bmod d} > \left\lfloor\frac{2^n}{d}\right\rfloor\right)$$

Where kopt is the smallest such valid k hence:

$$\frac{1}{2^{k_{opt}-1}}\left\lceil\frac{2^{k_{opt}-1}}{d}\right\rceil \geq \frac{\lceil 2^n/d \rceil}{d\lfloor 2^n/d \rfloor}$$

$$2\left\lceil\frac{2^{k_{opt}-1}}{d}\right\rceil \geq \frac{2^{k_{opt}}\lceil 2^n/d \rceil}{d\lfloor 2^n/d \rfloor}$$

$$\left\lceil\frac{2^{k_{opt}}}{d}\right\rceil + 1 \geq \frac{2^{k_{opt}}\lceil 2^n/d \rceil}{d\lfloor 2^n/d \rfloor}$$

Hence $a = \text{ceil}(2^{k_{opt}}/d)$ valid but $a = \text{ceil}(2^{k_{opt}}/d) + 1$ is not valid. It follows that the there is only a valid value for a when k=kopt. We can now state that the design which minimises k and satisfies $ad - 2^k > 0$ is unique and is defined by:

$$k_{opt}^+ = \min\left(k: \frac{2^k}{(-2^k)\bmod d} > \left\lfloor\frac{2^n}{d}\right\rfloor\right)$$

$$a_{opt}^+ = \left\lceil\frac{2^{k_{opt}^+}}{d}\right\rceil$$

$$b_{opt}^+ = 0$$

FR1 Minimal Hardware Implementation when $ad - 2^K < 0$

In this case we need:

$$\lfloor 2^n/d \rfloor (2^k - ad) \leq b < 2^k$$

Now b must live in a non empty interval so:

$$2^k > \lfloor 2^n/d \rfloor (2^k - ad)$$

$$\frac{2^k}{d} > a > \frac{2^k(\lfloor 2^n/d \rfloor - 1)}{d\lfloor 2^n/d \rfloor}$$

Given that a must be an integer we have a formula for kopt:

$$k_{opt} = \min\left(k: \frac{1}{2^k}\left\lfloor\frac{2^k}{d}\right\rfloor < \frac{\lfloor 2^n/d \rfloor - 1}{d\lfloor 2^n/d \rfloor}\right)$$

$$k_{opt} = \min\left(k: \frac{2^k}{2^k \bmod d} > \left\lfloor\frac{2^n}{d}\right\rfloor\right)$$

Where kopt is the smallest such valid k hence:

$$\frac{1}{2^{k_{opt}-1}}\left\lfloor\frac{2^{k_{opt}-1}}{d}\right\rfloor \leq \frac{\lfloor 2^n/d \rfloor - 1}{d\lfloor 2^n/d \rfloor}$$

$$2\left\lfloor\frac{2^{k_{opt}-1}}{d}\right\rfloor \leq \frac{2^{k_{opt}}(\lfloor 2^n/d \rfloor - 1)}{d\lfloor 2^n/d \rfloor}$$

$$\left\lfloor\frac{2^{k_{opt}}}{d}\right\rfloor - 1 \leq \frac{2^{k_{opt}}(\lfloor 2^n/d \rfloor - 1)}{d\lfloor 2^n/d \rfloor}$$

Hence $a = \text{floor}(2^{k_{opt}}/d)$ is valid but $a = \text{floor}(2^{k_{opt}}/d) - 1$ is not valid. It follows that the there is only a valid value for a when k=kopt. We can now state that the design which minimises k and satisfies $ad - 2^k < 0$ is unique in k and a and is defined by:

$$k_{opt}^- = \min\left(k: \frac{2^k}{2^k \bmod d} > \left\lfloor\frac{2^n}{d}\right\rfloor\right)$$

$$a_{opt}^- = \left\lfloor\frac{2^{k_{opt}^-}}{d}\right\rfloor$$

$$b_{opt}^- = \text{minHamm}\left((2^{k_{opt}^-} - a_{opt}^- d)\lfloor 2^n/d \rfloor, 2^{k_{opt}^-} - 1\right)$$

Where minHamm(a, b) returns the number of smallest value from the numbers of smallest Hamming weight found within the interval [a, b].

FR1 Minimal Hardware Design

Summarising the previous sections we have the following algorithm:

$$k_{opt}^+ = \min\left(k: \frac{2^k}{(-2^k)\bmod d} > \left\lfloor\frac{2^n}{d}\right\rfloor\right)$$

$$a_{opt}^+ = \left\lceil\frac{2^{k_{opt}^+}}{d}\right\rceil$$

$$b_{opt}^+ = 0$$

$$k_{opt}^- = \min\left(k: \frac{2^k}{2^k \bmod d} > \left\lfloor\frac{2^n}{d}\right\rfloor\right)$$

$$a_{opt}^- = \left\lfloor\frac{2^{k_{opt}^-}}{d}\right\rfloor$$

$$b_{opt}^- = \text{minHamm}\left((2^{k_{opt}^-} - a_{opt}^- d)\lfloor 2^n/d \rfloor, 2^{k_{opt}^-} - 1\right)$$

$$\{k_{opt}, a_{opt}, b_{opt}\} = (k_{opt}^+ < k_{opt}^-) ? \{k_{opt}^+, a_{opt}^+, b_{opt}^+\} : \{k_{opt}^-, a_{opt}^-, b_{opt}^-\}$$

Note that kopt$^+$ is never equal to kopt$^-$, else if kopt=kopt$^+$=kopt$^-$ then:

$$\frac{2^k}{(-2^k)\bmod d} > \left\lfloor\frac{2^n}{d}\right\rfloor \geq \frac{2^{k-1}}{(-2^{k-1})\bmod d}$$

$$\frac{2^k}{2^k\bmod d} > \left\lfloor\frac{2^n}{d}\right\rfloor \geq \frac{2^{k-1}}{2^{k-1}\bmod d}$$

Simplifying these two conditions we get:

$2((-2^{k-1})\bmod d) > (-2^k)\bmod d$ $2(2^{k-1} \bmod d) > 2^k \bmod d$ $2(2^{k-1} \bmod d) > 2^k \bmod d > 2(2^{k-1} \bmod d) - d$ This is a contradiction as $2^k$ mod d is equal to one of these limits.

Where $$k^+ = \min\left(k: \frac{2^k}{(-2^k)\bmod d} > X^+\right)$$

$$k^- = \min\left(k: \frac{2^k}{2^k\bmod d} > X^-\right)$$

$$a^+ = \left\lceil\frac{2^{k^+}}{d}\right\rceil$$

$$a^- = \left\lfloor\frac{2^{k^-}}{d}\right\rfloor$$

And

|  | RTZ | RTN | FR1 |
|---|---|---|---|
| X$^+$ | $d\left\lfloor\frac{2^n}{d}\right\rfloor - 1$ | $d\left\lfloor\frac{2^{n+1}-d-1}{2d}\right\rfloor - 1$ | $\left\lfloor\frac{2^n}{d}\right\rfloor$ |
| X$^-$ | $d\left\lfloor\frac{2^n}{d}\right\rfloor - d + 1$ | $d\left\lfloor\frac{2^{n+1}-d-3}{2d}\right\rfloor + 1$ | $\left\lfloor\frac{2^n}{d}\right\rfloor$ |
| Y$^+$(k, a) | (0, 0) | $\left(a\left(\frac{d-1}{2}\right) + 2^k - ad,\; a\left(\frac{d-1}{2}\right) + (2^k - ad)\left\lfloor\frac{2^{n+1}+d-1}{2d}\right\rfloor - 1\right)$ | (0, 0) |
| Y$^-$(k, a) | $\left((2^k - ad)\lfloor 2^n/d\rfloor,\; 2^k - a(d-1) - 1\right)$ | $\left(a\left(\frac{d-1}{2}\right) + (2^k - ad)\left\lfloor\frac{2^{n+1}+d-3}{2d}\right\rfloor,\; a\left(\frac{d+1}{2}\right) + 2^k - ad - 1,\right)$ | $((2^k - ad)\lfloor 2^n/d\rfloor,\; 2^k - 1)$ |

Invariant Integer Division Synthesiser

Example structure of a synthesis apparatus according to the disclosure that performs invariant integer division is depicted in FIG. 1.

This shows a parameter creation unit 2 which has three inputs n, d and rounding mode. n is the number of bits to be used in the numerator of the division, d is the divisor, and the rounding mode is a selection of one of a plurality of rounding modes. Three examples are given here but others are possible.

The parameter creation unit 2 generates in dependence on the inputs n, d, and rounding mode, the integer triple (a, b, k) required by an RTL generator k to generate an appropriate RTL representation of the circuitry for performing the division for the said number of bits of n and rounding mode, and for additional conditions provided to the RTL generation. The RTL generator is computer controlled to generate an RTL representation of a division for the integer triple using additional conditions such as ad$-2^k$<0.

The RTL representation is then output to a synthesis tool 6 which generates the hardware circuits required to implement the division on an appropriate part of an integrated circuit.

The algorithm in the parameter creation may be summarised as:

$\{k,a,b\} = (k^+ < k^-) ? \{k^+, a^+, \min \mathrm{Hamm}(Y^+(k^-a^+))\}$:
$\{k^-, a^-, \min \mathrm{Hamm}(Y^-(k^-, a^-))\}$ Specific Example of the Idea: Application to the Multiplication of Normalised Numbers An unsigned n bit normalised number x is interpreted as holding the value $x/(2^n-1)$. Multiplication of these numbers thus involves computing the following:

$$\frac{y}{2^n-1} \approx \frac{a}{2^n-1}\frac{b}{2^n-1}$$

$$y \approx \frac{ab}{2^n-1}$$

We can apply the previously found results to implementing this design for the three rounding modes. In this case $d=2^n-1$ and given that $ab \leq (2^n-1)$ then $2^n-1$ in the previous sections will be replaced by $(2^n-1)^2$. Substituting these values into the previous sections gives rise to the following three rounding:

$$RTZ\left(\frac{ab}{2^n-1}\right) = \left\lfloor\frac{(2^n+1)ab + 2^n}{2^{2n}}\right\rfloor$$

$$RTN\left(\frac{ab}{2^n-1}\right) = \left\lfloor\frac{(2^n+1)(ab+2^{n-1})}{2^{2n}}\right\rfloor$$

-continued $$FR1\left(\frac{ab}{2^n-1}\right) = \left\lfloor \frac{ab+2^n-1}{2^n} \right\rfloor$$

Note that the RTN case gives a generalisation and proof of the formula for such multiplication [2]. Note that the allowable interval for the additive constant in each case is $[2^n-1, 2^n+1]$, $[2^{n-1}(2^n+1)-2, 2^{n-1}(2^n+1)]$ and no freedom for the FR1 case.

Alternative Implementations

Further implementations can be realized by those skilled in the art based on the following disclosures, to deal with the following situations:
1) d is even. Note that if d is a power of 2 then we have the trivial implementations:

$$RTZ\left(\frac{x}{d}\right) = FR1\left(\frac{x}{d}\right) = x >> \log_2(d)$$

$$RTN\left(\frac{x}{d}\right) = (x+d/2) >> \log_2(d)$$

2) If x lives in the interval [0,max] and not $[0,2^n-1]$ then it suffices to replace $2^n$ the formulae above with max+1.
3) If x can take negative the formulae can be reworked using the framework established above.
4) Other rounding modes—the formulae can be reworked using the framework established above.
5) The hardware scheme has been chosen to minimize the size of the final shift—a different scheme could be applied which would result in different equations for optimal a, b and k.

In summary of the above, FIG. 1 depicts an example where a parameter creator inputs n, d, and a desired rounding mode, and outputs integer triple a, b, and k. An RTL generator 11 receives the a, b, and k. RTL generator 11 generates RTL for (a*x+b)>>k according to the parameters. The generated RTL is input to a synthesis tool 12, which outputs a hardware layout that can be fabricated in a fabrication process.

FIG. 2 depicts an example method, where integer triple (a, b, k) is derived 15 for a rounding mode and conditions. At 16, a minimum value of k is derived (16 is depicted separately from 15, for ease of explanation). At 17, an RTL representation of $(ax+b)/2^k$ is derived. At 18, a hardware layout is derived from the RTL. At 19, a circuit can be manufactured according to the hardware layout.

FIG. 3 depicts exemplary apparatus in which methods can be implemented. A processor 25 interfaces with a user interface 30 and with a display 32. A RAM 26 and non-volatile storage 28 interfaces with processor 25. These memories are tangible memories that can store instructions for configuring processor 25 to perform aspects of the disclosure.

What is claimed is:

1. A computer-implemented method for generating a representation of an integrated circuit for performing invariant integer division x/d, the method comprising:
   receiving n, d, and a desired rounding mode as inputs to a parameter creator, wherein x is an n-bit number and d is an invariant integer constant;
   deriving, by the parameter creator, an integer triple (a,b,k) based on the desired rounding mode and a set of conditions, wherein Round(x/d)=$(ax+b)/2^k$ and the deriving of the integer triple (a,b,k) comprises deriving a minimum value of k based on the desired rounding mode and the set of conditions;
   deriving, by a representation generator, a representation of the logical operation $(ax+b)/2^k$ using the integer triple, the representation defining behavior of the integrated circuit; and
   generating, by a synthesis tool, the representation of said integrated circuit using the representation of the logical operation $(ax+b)/2^k$ for manufacture of said integrated circuit.

2. The method of claim 1, wherein the representation generator is an RTL (Register Transfer Level) generator, and wherein the representation of the logical operation $(ax+b)/2^k$ is an RTL representation.

3. The method of claim 1, wherein the desired rounding mode is one of: (i) round towards zero, (ii) round to nearest, and (iii) faithful rounding.

4. The method of claim 1, wherein the deriving the integer triple (a,b,k) further comprising deriving a value for b from values of k and a in which the derived value of b has the smallest Hamming weight of the possible values of b satisfying Round (x/d)=$(ax+b)/2^k$.

5. The method of claim 4, further comprising manufacturing the integrated circuit from said representation of said integrated circuit.

6. The method of claim 4, wherein said derivation of k is different for different rounding modes.

7. An apparatus implemented in one or more processors and configured to generate a representation of an integrated circuit for performing invariant integer division x/d, the apparatus comprising:
   a parameter creator configured to:
      receive n, d, and a desired rounding mode as inputs, wherein x is an n-bit number and d is an invariant integer constant; and
      derive an integer triple (a,b,k) based on the desired rounding mode and a set of conditions, wherein Round(x/d)=$(ax+b)/2^k$ and the deriving of the integer triple (a,b,k) comprises deriving a minimum value of k based on the desired rounding mode and the set of conditions;
   a representation generator configured to derive a representation of the logical operation $(ax+b)/2^k$ using the integer triple, the representation defining behavior of the integrated circuit; and
   a synthesis tool configured to generate the representation of said integrated circuit from the representation of the logical operation $(ax+b)/2^k$ for manufacture of said integrated circuit.

8. The apparatus of claim 7, wherein the parameter creator is configured to derive a value for b from values of a and k, the derived value of b having the smallest Hamming weight of the possible values of b satisfying Round (x/d)=$(ax+b)/2^k$.

9. The apparatus of claim 7, wherein the representation generator is an RTL (Register Transfer Level) generator, and wherein the representation of the logical operation $(ax+b)/2^k$ is an RTL representation.

10. The apparatus of claim 7, wherein the desired rounding mode is one of: (i) round towards zero, (ii) round to nearest, and (iii) faithful rounding.

11. The apparatus of claim 7, wherein the parameter creator is further configured to derive k differently for different rounding modes.

12. A non-transitory computer readable medium having stored thereon computer executable instructions that when executed cause at least one processor to:
   receive n, d, and a desired rounding mode as inputs to a parameter creator, wherein x is an n-bit number and d is an invariant integer constant;

derive, by the parameter creator, an integer triple (a,b,k) based on the desired rounding mode and a set of conditions, wherein Round(x/d)=(ax+b)/$2^k$ and the deriving of the integer triple (a,b,k) comprises deriving a minimum value of k based on the desired rounding mode and the set of conditions;

derive, by a representation generator, a representation of the logical operation (ax+b)/$2^k$ using the integer triple, the representation defining behavior of the integrated circuit; and generate, by a synthesis tool, the representation of said integrated circuit from the representation of the logical operation (ax+b)/$2^k$ for manufacture of said integrated circuit.

13. The non-transitory computer readable medium of claim 12, wherein the representation generator is an RTL (Register Transfer Level) generator, and wherein the representation of the logical operation (ax+b)/$2^k$ is an RTL representation.

14. The non-transitory computer readable medium of claim 12, wherein the desired rounding mode is one of: (i) round towards zero, (ii) round to nearest, and (iii) faithful rounding.

15. The non-transitory computer readable medium of claim 12, wherein deriving the integer triple further comprises deriving a value for b from values of k and a, in which the derived value of b has the smallest Hamming weight of the possible values of b satisfying Round (x/d)=(ax+b)/$2^k$.

16. The non-transitory computer readable medium of claim 12, wherein said derivation of k is different for different rounding modes.

17. A method of manufacturing, using an integrated circuit manufacturing system, an integrated circuit for performing invariant integer division, the method comprising:

processing, using a layout processing system, a representation of an integrated circuit for performing invariant division so as to generate a circuit layout description of an integrated circuit for performing invariant integer division, the representation of the integrated circuit for performing invariant integer division being generated in accordance with the method as set forth in claim 1; and manufacturing, using an integrated circuit generation system, the integrated circuit for performing invariant integer division according to the circuit layout description.

* * * * *